(12) United States Patent
Todorov et al.

(10) Patent No.: US 6,447,637 B1
(45) Date of Patent: Sep. 10, 2002

(54) PROCESS CHAMBER HAVING A VOLTAGE DISTRIBUTION ELECTRODE

(75) Inventors: Valentin N. Todorov, Fremont; Robert E. Ryan; Arthur Sato, both of San Jose, all of CA (US); Jin-Yuan Chen, Bountiful, UT (US); Xueyu Qian; Zhiwen Sun, both of San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 78 days.

(21) Appl. No.: 09/602,652

(22) Filed: Jun. 22, 2000

Related U.S. Application Data
(60) Provisional application No. 60/143,362, filed on Jul. 12, 1999.

(51) Int. Cl.[7] .......................... C23F 1/00; C23C 16/505; C23C 16/507
(52) U.S. Cl. ................ 156/345.48; 118/723 I; 118/723 R; 118/723 E
(58) Field of Search ................ 156/345; 118/723 E, 118/723 I

(56) References Cited

U.S. PATENT DOCUMENTS

| | | | |
|---|---|---|---|
| 5,540,800 A | 7/1996 | Qian | 156/345 |
| 5,650,032 A | 7/1997 | Keller et al. | 156/345 |
| 5,681,418 A | 10/1997 | Ishimaru | 156/345 |
| 5,685,941 A | 11/1997 | Forster et al. | 156/345 |
| 5,811,022 A | 9/1998 | Savas et al. | 216/68 |
| 5,903,106 A | 5/1999 | Young et al. | 315/111.41 |
| 5,944,899 A | 8/1999 | Guo et al. | 118/715 |
| 6,280,563 B1 * | 8/2001 | Baldwin, Jr. et al. | 156/345 |

FOREIGN PATENT DOCUMENTS

| | | | |
|---|---|---|---|
| EP | 0607797 A1 | 7/1994 | H01J/37/32 |
| EP | 0838841 A2 | 4/1998 | H01J/37/32 |
| WO | WO 98/11594 | 3/1998 | H01J/37/32 |
| WO | WO 99/34399 | 7/1999 | H01J/37/32 |

OTHER PUBLICATIONS

PCT International Search Report dated Dec. 6, 2000.

* cited by examiner

Primary Examiner—Gregory Mills
Assistant Examiner—Rudy Zervigon
(74) Attorney, Agent, or Firm—Moser, Patterson, & Sheridan; Joseph Bach

(57) ABSTRACT

The present invention provides a process chamber and voltage distributive electrode (VDE) which distributes capacitive coupling between an inductive source and a plasma in a process chamber. The VDE is preferably slotted defining energy opaque and energy transparent portions which enable inductive coupling into the chamber while distributing capacitive coupling uniformly over the dielectric window.

12 Claims, 8 Drawing Sheets

PROCESS CHAMBER HAVING A VOLTAGE DISTRIBUTION ELECTRODE

This application claims the benefit of provisional U.S. patent application No. 60/143,362; filed on Jul. 12, 1999, which application is incorporated herein by reference.

BACKGROUND OF THE INVENTION

1. Field of the Invention

The invention relates generally to methods and apparatus for fabricating electronic devices, such as integrated circuits, on substrates. More particularly, the invention relates to methods and apparatus for processing substrates using an inductively coupled plasma system.

2. Background of the Related Art

A variety of processes are currently used in the fabrication of integrated circuits and other electronic devices. For example, processes such as chemical vapor deposition and physical vapor deposition are used to deposit various conductive, semiconductive and dielectric materials onto substrates. In addition, etching processes are used to remove various conductive, semiconductive and dielectric materials from substrates. Both deposition and etch processes can include the use of a plasma generated in a processing chamber. One etch process used to advantage is an inductively coupled plasma etch process which uses an inductive coil to deliver RF energy into the chamber to excite gases introduced into the chamber into a plasma state. A conventional inductively coupled plasma (ICP) etch chamber is typically operated at a pressure of about 2–40 millitorr. A substrate being processed is mounted on a support member connected to a source of RF bias voltage and spaced from and generally below the RF inductive coil. Plasma is struck in the processing gas by the application of RF power to the RF coil, and the positive gas ions created in the chamber are attracted to the negatively biased substrate being processed. Depending on the gases used, a physical etching, a reactive etching or a combination physical and reactive etching occurs to remove material from the surface of the substrate being processed.

However, inductively coupled plasma processes are not typically truly inductive processes even though an inductive coil arrangement is used. As with most inductively coupled plasma hardware designs, ostensibly a significant amount of RF power is capacitively coupled through the dielectric window to the plasma via the high RF voltages occurring in the inductive coil. Indeed, it has been some capacitive coupling Measurements have shown that the typical working values of this RF voltage are between about 1200 and 3400 V peak. The coupling of plasma to these high voltages can result in erosion of the dielectric window of the chamber through ion bombardment. In applications where the dielectric window is a ceramic, such as aluminum oxide, the erosion of this material creates aluminum contamination within the chamber.

Typically, upon inspection of the internal surfaces of a dome after processing, heavy film deposits are present in the center and edge regions of the dome, but are clean from deposition in the region directly beneath the inductive source coil. The deposition build-up occurs because as material is removed in an etch process, the material typically deposits on other surfaces within the chamber. The area directly beneath the coil is kept clean by bombardment of the surfaces by particles generated in the plasma and attracted to the surface by the capacitive field generated by the inductive coil. The edges of the regions where heavy deposition occurs can peel away from the dome, resulting in high levels of particle contamination both on substrates processed in the chamber as well as in the chamber itself.

It is believed that capacitive coupling of the RF power into the plasma has this undesired effect on the erosion of the chamber dome and on the measured aluminum contamination levels in the chamber. For fluorine-based plasmas, the reduction of the capacitive coupling between the coil and the plasma is found to reduce the level of aluminum contamination. One attempt to decrease this coupling to essentially zero by use of a grounded electrostatic or Faraday shield is described in U.S. Pat. No. 5,811,022, entitled "Inductive Plasma Reactor" which issued on Sep. 22, 1998 and which is incorporated herein by reference.

Several problems can arise if a Faraday Shield, i.e., a grounded shield, is used.

If the shield is properly designed, the shield will effectively eliminate any capacitive coupling between the inductive coil and the gases in the chamber, thereby minimizing the ability to ignite the plasma using only the inductive source because a higher voltage breakdown is needed to initiate the plasma discharge using a purely inductive source. Additionally, complete elimination of all capacitive coupling between the plasma and source coil has been found to have a detrimental effect on plasma stability for certain electronegative processing gasses. This effect has been seen to increase the RF source power required to sustain plasma for some processing gases.

Therefore, there is a need for an ICP system which can ignite plasma using capacitive coupling of power into a chamber, can maintain plasma using inductive coupling and can minimize the generation of particles and other contamination within the chamber.

SUMMARY OF THE INVENTION

The invention generally provides an ICP etch system having a voltage distribution electrode (VDE) disposed between an inductive coil and a dielectric window (i.e., a dome or a lid) of a chamber. The VDE generally forms a radially slotted shield which conforms to the geometry of the dielectric window of the chamber to provide substantially full window coverage. The VDE is preferably electrically floating, i.e., electrically isolated from both the inductive coil and ground. When the VDE is electrically floating, the field due to capacitive coupling from the inductive coil is coupled to the shield and is distributed across the area of the VDE. However, the VDE can also be connected to ground via a switch or relay to provide a grounded shield which could be utilized to advantage as a Faraday shield. Additionally, the VDE could be connected to a power source to power the VDE in desired applications such as etching or chamber cleaning. Still further, the shield could be connected to ground via a circuit element of non-zero impedance to moderate the potential on the shield between ground potential and the potential present when the shield is floating.

In another aspect, the invention provides a voltage distribution electrode for use in an inductively coupled plasma chamber. The VDE is preferably adapted and configured to minimize eddy current losses and may include multiple fingers or conductors defining generally parallel gaps therebetween. The VDE can be switched between an electrically floating configuration, a grounded configuration or a powered configuration.

In another aspect, the invention provides a method of distributing (thereby reducing the current density) the capacitive coupling of a RF voltage delivered to an inductive coil into a chamber. The method generally includes providing an electrically floating VDE between an inductive coil and a dielectric window of a chamber to distribute the voltage coupled to the shield over a large area.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
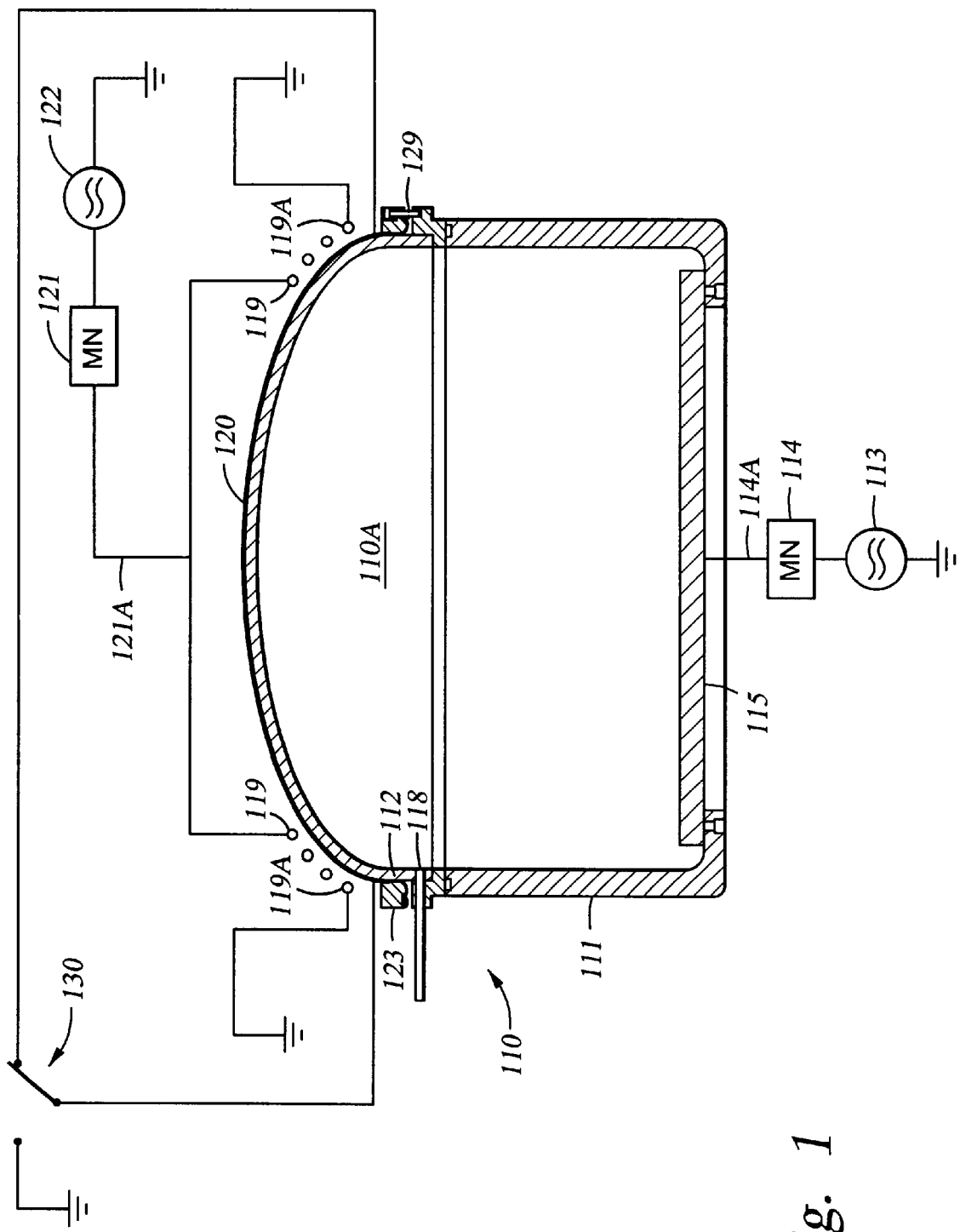
FIG. 1 is a schematic cross sectional view illustrating an ICP etching system of the invention.
Figure 5:
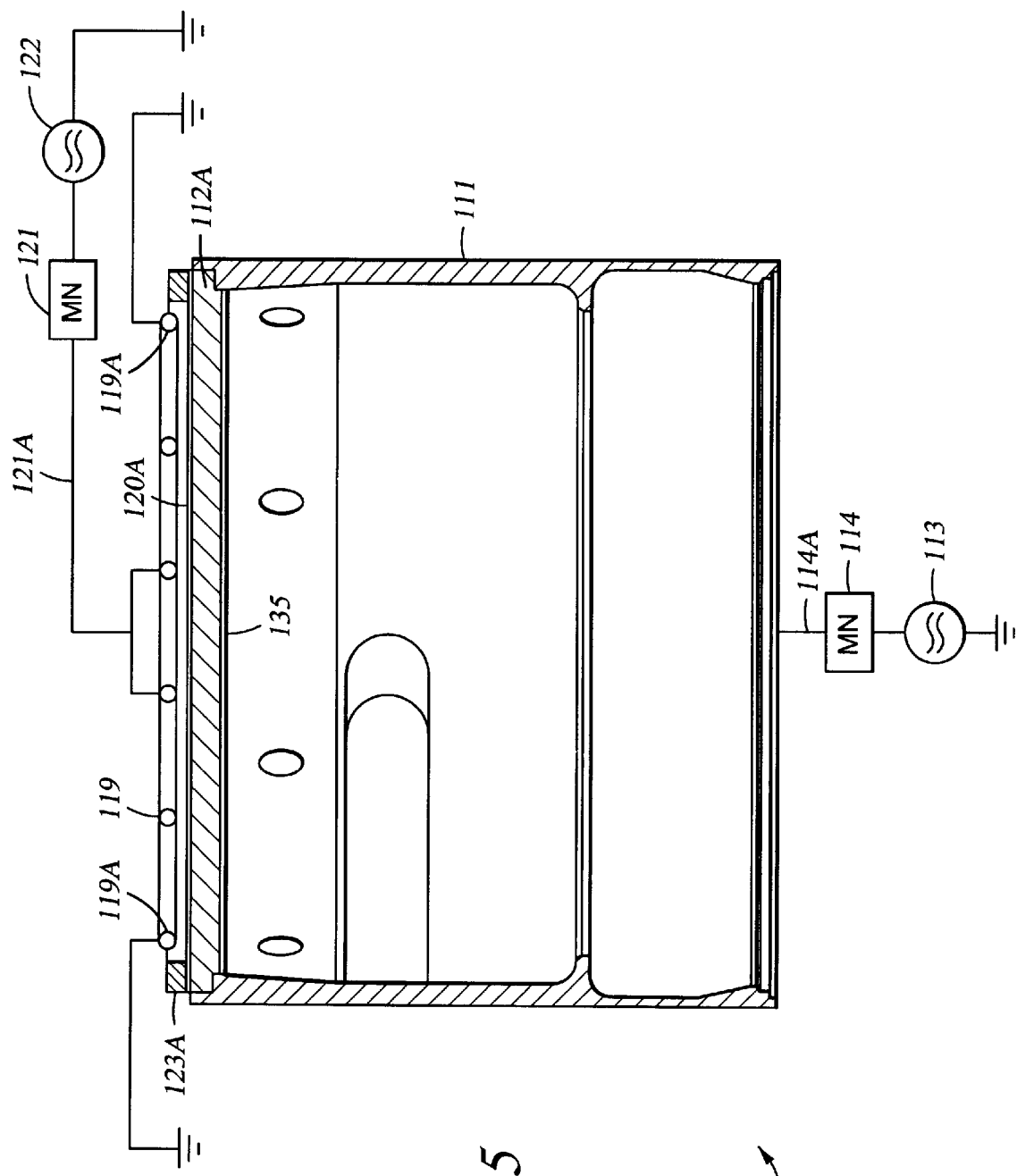
FIG. 5 is a cross sectional view illustrating another embodiment of an ICP etching system of the invention.

FIG. 1 is a schematic cross sectional view showing an ICP chamber 110 of the invention. The chamber 110 generally includes a chamber body 111 and a dielectric window 112 at least partially forming a lid on the chamber body. The dielectric window 112 can be domed as shown in FIG. 1, flat as shown in FIG. 5 or otherwise configured to enable inductive coupling of energy into the chamber. The dielectric window 112 is preferably made of a ceramic such as aluminum oxide, quartz, silicon carbide (SiC), TEFLON, G10 or other dielectric, nonconductive or semiconductive material. A gas port 118 introduces a processing gas or gas mixture into the chamber 110 from a gas supply (not shown). A vacuum pumping system maintains a desired gas pressure within chamber 110 during processing. An inductive RF source coil 119 having a generally helical configuration conforming to the shape of the dielectric window 112 is wound or otherwise disposed around at least a portion of the top of the dielectric window 112 to inductively couple RF energy into the chamber to excite one or more processing gases introduced into the chamber 110 into a plasma state. A voltage distribution electrode (VDE) 120, generally conforming to the geometry of the dielectric window 112 is disposed between the inductive coil 119 and the dielectric window 112. The VDE can be form fitted onto the dielectric window and is preferably removably connected to the chamber by an insulative support ring 123 (or conductive support ring if the shield is grounded) or can be held in place on the dielectric window by an adhesive, such as a high temperature adhesive.

The RF source coil 119 is driven by a first RF power source 122 via an impedance matching network 121 and line 121A. The outer ends 119A of the coil 119 are preferably grounded. Alternatively, the outer ends of the coil could be powered and the center of the coil could be grounded. A second RF bias power source 113 supplies an RF bias voltage to the substrate pedestal 115 via matching network 114 and line 114A. The RF source coil is driven at an operating frequency slightly less than the RF bias supply 113, which is preferably operated at about 13.56 MHz. This frequency difference tends to minimize stray capacitive coupling between the RF power sources.

Figure 2:
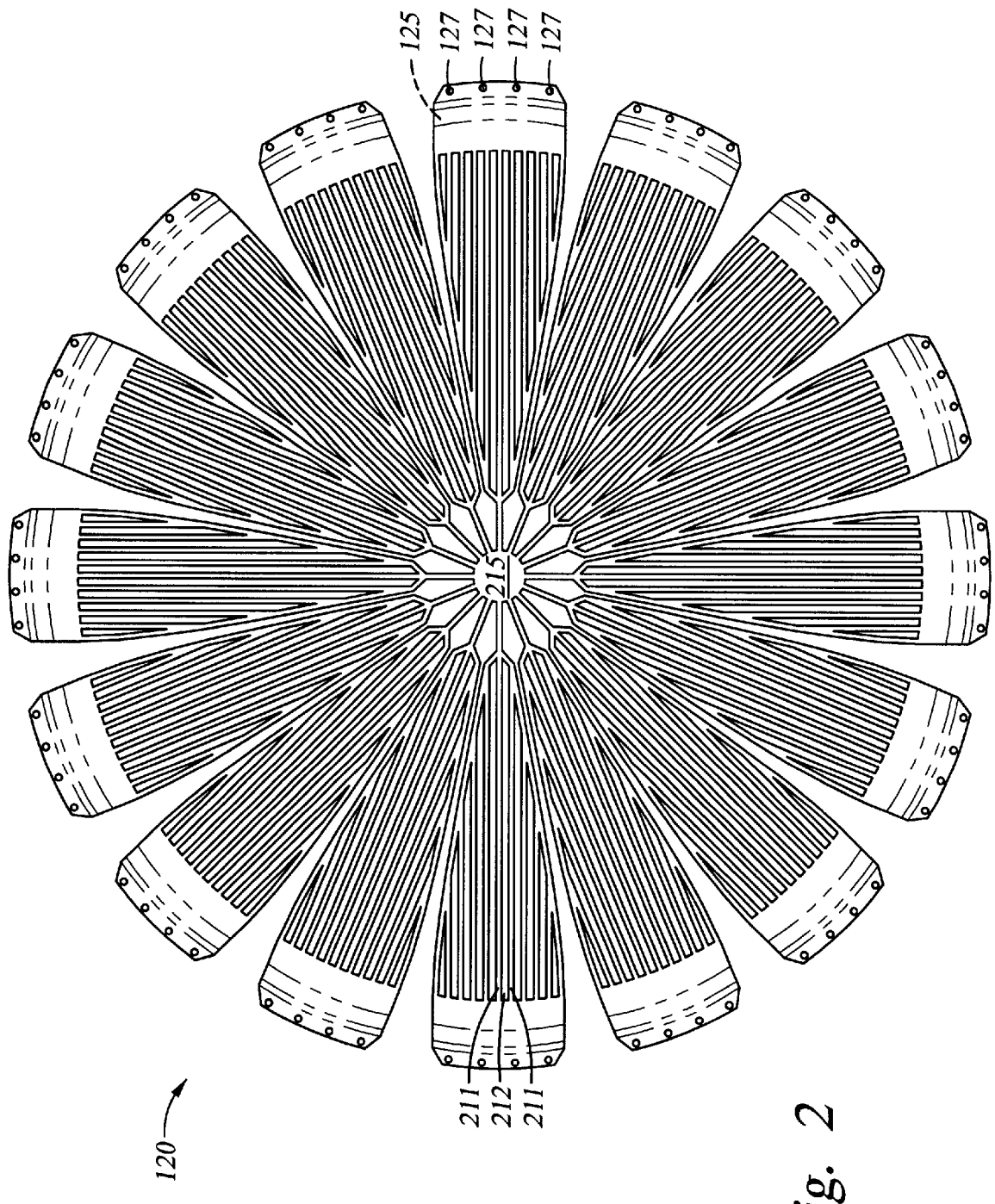
FIG. 2 is a top view of one VDE of the invention.

FIG. 2 is a top view of a VDE 120 of the invention showing one pattern of conductors. The VDE shield generally includes a central hub 215 having a plurality of radially extending narrow conductors 211 extending therefrom and defining energy transparent slots 212 therebetween through which RF energy can be inductively coupled into the chamber from the inductive coil 119 (shown in FIG. 1). The narrow conductors 211 are disposed perpendicular to the direction of current flow in the RF inductive coil 119 when the VDE is disposed on the dielectric dome window 112 shown in FIG. 1 and are preferably made of copper. It is believed that the electrically transparent slots 212 prevent the VDE shield 120 from having current loops induced transversely in the VDE. However, the adjacent transparent slots 212 are spaced close enough to one another to prevent significant direct capacitive coupling (i.e., directly through the shielded slots) between the plasma and the inductive coil 119. The conductors and slots preferably form a symmetrical pattern about the surface of the dielectric dome window 112 to provide uniform coupling of energy into the chamber while providing a uniform voltage electrode to which the capacitive fields can be distributed. The amount of capacitively coupled current may be about the same with or without the VDE, however, with the VDE, the current is distributed over a larger area, thus lowering the RF current density at a particular point adjacent to the dielectric window. The sheath voltage at the plasma-window interface varies nearly quadratically with the current density, thus the decrease in the current density significantly reduces the ion energy at the window surface.

The VDE can be made using flexible printed circuit board technology which utilizes patterned etching to form copper conductors on a dielectric backing member 125, such as a polyimide. The polyimide is shaped to conform to the outer surface of the dielectric window and has a desired thickness of copper deposited thereover. The pattern of conductors 211 is then formed by etching away the copper in the areas of the gaps 212. While this printed circuit board (PCB) technology is preferred, other methods known to form the conductors could also be used. For example, the conductors could be formed individually and mounted on a dielectric backing member or attached directly onto the dielectric window.

Figure 3:
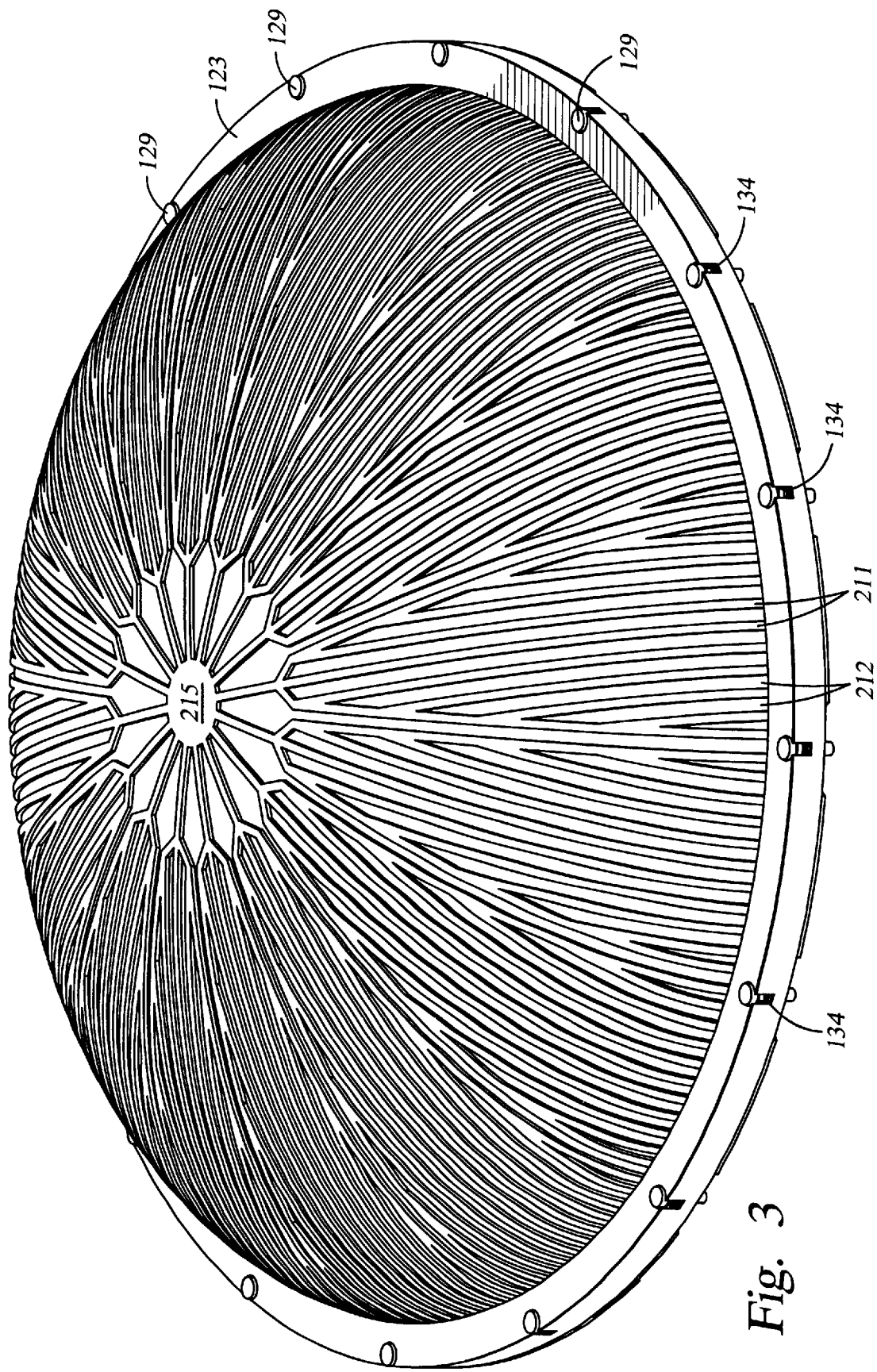
FIG. 3 is a substantially top perspective view of a VDE mounted to a support ring.
Figure 4:
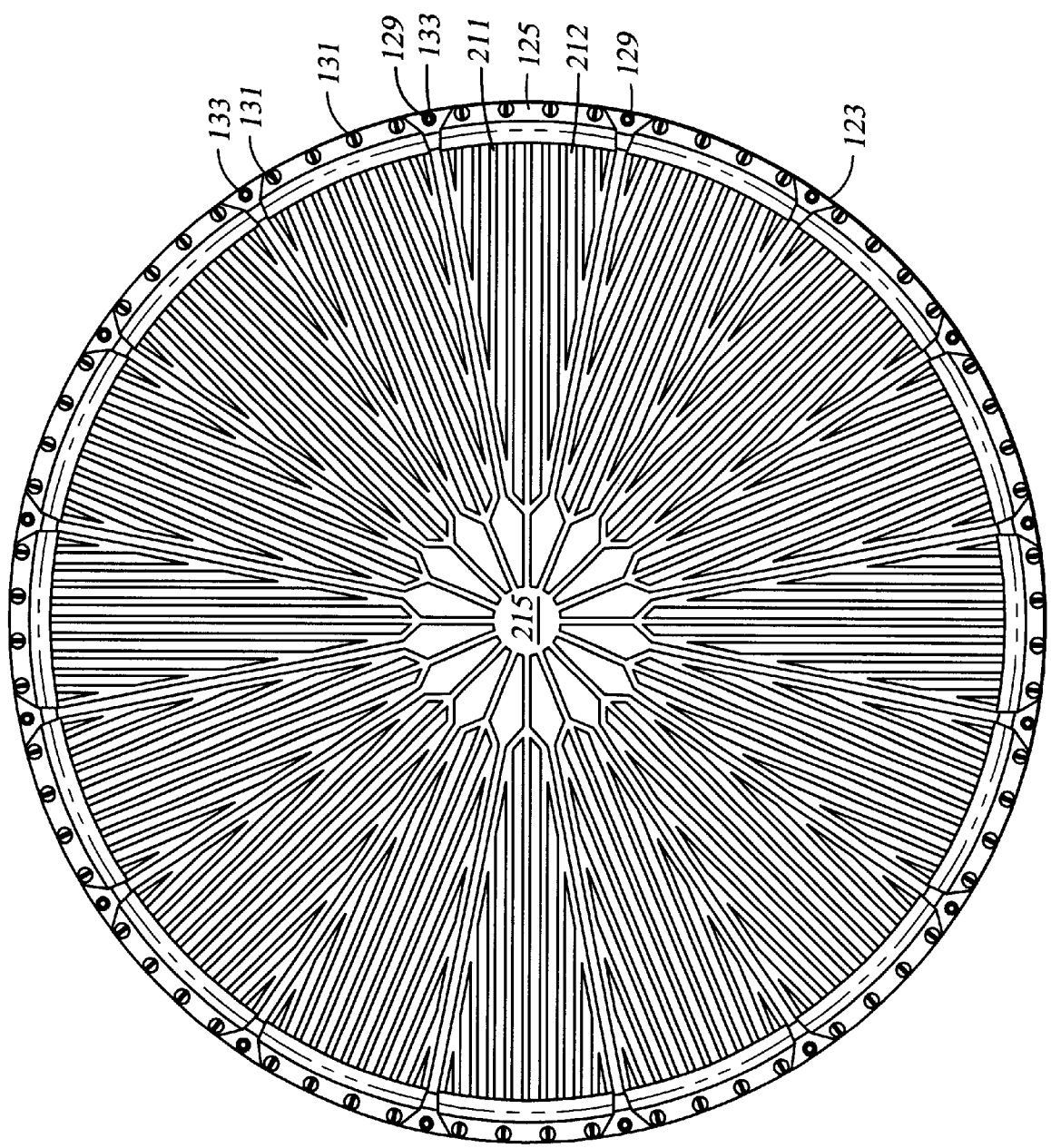
FIG. 4 is a bottom view of a support ring mounting a VDE thereon.

As shown in FIGS. 1, 3 and 4, a support ring 123 is provided to mount the VDE and support the VDE on the dielectric window. The support ring 123 is preferably an insulative ring made of a material such as Teflon or other dielectric material. The ends of the VDE have holes 127 (shown in FIG. 2). Disposed around the lower surface of the support ring 123 are a plurality of threaded holes that match the holes 127 on the VDE. Holes 127 on the VDE and threaded holes on the support ring work in conjunction with screws 131 to attach the VDE to the support ring 123. Other methods of attaching the VDE could also be used, including, but not limited to, the use of high temperature adhesives.

Preferably, the VDE 120 is electrically floating to distribute capacitive coupling between the inductive coil and the plasma. Additionally as shown in FIG. 1, the VDE 120 can be connected through a switch 130 to ground so that the VDE can be selectively grounded to function as a Faraday Shield. A RF relay actuated switch 130 allows switching between a grounded position and a free floating position. In addition, the VDE could be selectively connectable to a power source through a relay actuated switch to power the electrode in desired applications. A foil thickness (i.e., the thickness of the conductors 211) of less than the skin depth for the frequency used is preferred so that the power losses due to eddy currents will be reduced to negligible levels. For example, a foil thickness of about 2.5 to about 4.5 mils is sufficient to reduce to negligible levels the power losses due to heating by induced eddy currents in the embodiments described herein.

FIG. 5 is a cross sectional view of a processing chamber 110A having a flat dielectric window 112A and a VDE 120A disposed between the dielectric window and an inductive coil 119. The dielectric window 112A may include a silicon containing liner 135 on the surface disposed in the chamber. As one example, a polysilicon liner 135 may be provided on the dielectric window. The VDE 120A can be similarly attached to the chamber by a support ring 123A similar to support ring 123 described above. In addition, high temperature adhesives could be used among other known techniques to secure the VDE adjacent the dielectric window.

Figure 6:
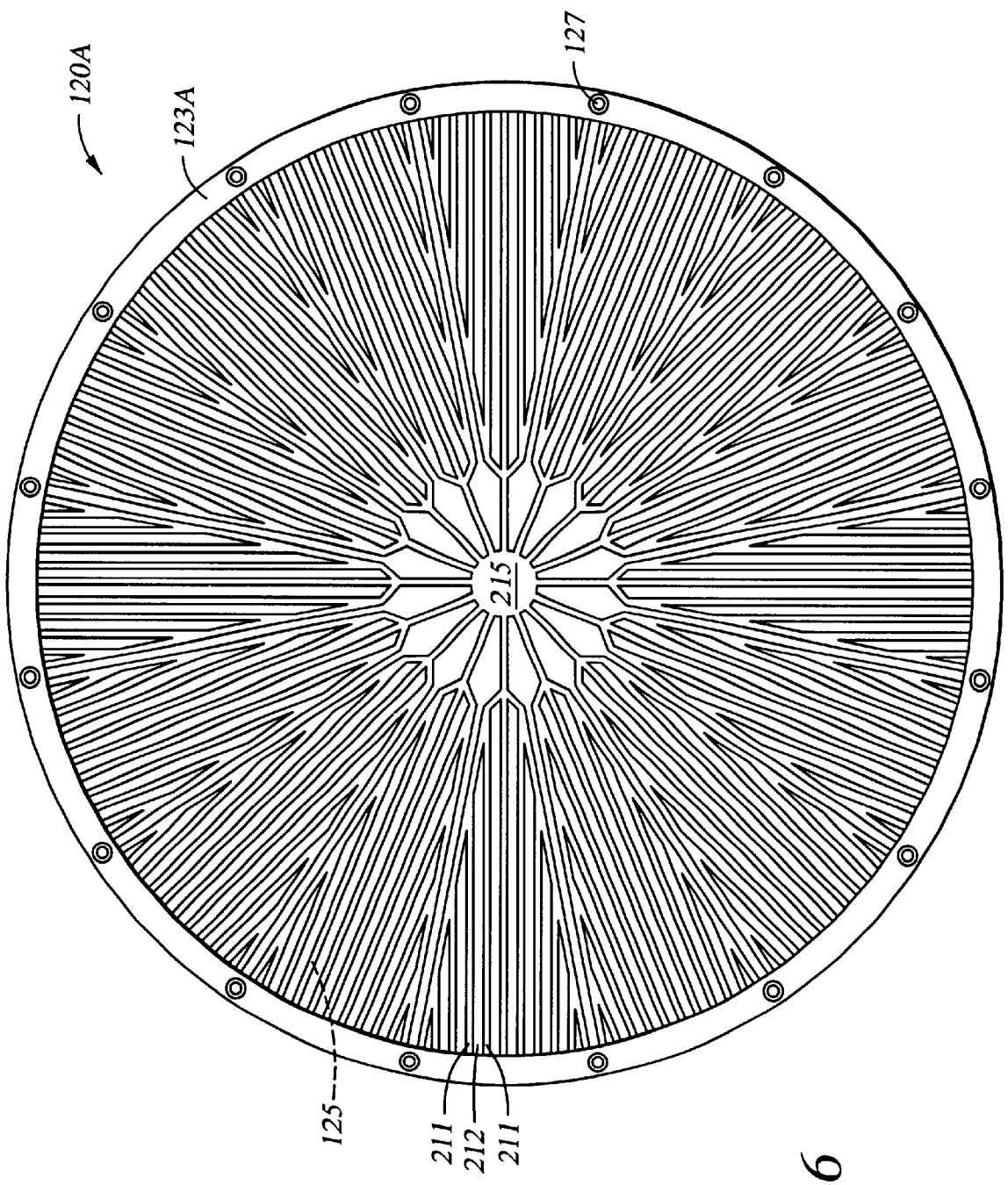
FIG. 6 is a top view of another embodiment of a VDE of the invention.

FIG. 6 is a top view of an alternate VDE pattern 120A, which can be used with a flat dielectric window. Similar to the VDE pattern 120 described above, the VDE pattern 120A, includes a central hub 215 having a plurality of conductors 211, extending outwardly therefrom, and defining gaps 212 therebetween. VDE pattern 120A has a plurality of holes (not shown) arranged on an outer band (not shown) similar to the outer band and holes 127 of the VDE pattern 120 described above and shown in FIG. 2. The support ring 123A has a plurality of threaded holes (not shown) that match the holes (not shown) on the outer band of VDE pattern 120A, which work in conjunction with fasteners to connect the VDE 120A to the support ring 123A.

It has been discovered that the size and shape of the conductors 211 and the gaps 212 defined therebetween significantly impact the performance of the VDE. In a preferred embodiment, the conductor width is minimized and the length is maximized to reduce the eddy current losses in the VDE. In the embodiments shown and described above, the length desired to minimize the eddy current losses can be derived as follows:

Let A=the surface area of the shield metal, B(t)=the time varying magnetic field piercing the area of the shield, Φ=A*B(t)=the magnetic flux through the shield, and E=the induced electromotance (that is, voltage) which drives the eddy currents in the shield metal. Then by Faraday's Law, $$E = -d\Phi/dt = -A \times dB/dt \qquad \text{(equation 1)}$$

The power loss due to eddy currents will scale like the simple ohmic power loss:

$$P = \tfrac{1}{2} E^2 / R \qquad \text{(equation 2)}$$

where R is the effective resistance integrated over the path that the eddy current takes:

$$R \approx \rho L_p / A_c \qquad \text{(equation 3)}$$

where ρ=the material resistivity, $L_p$=the length of the perimeter of the shield metal, and $A_c$=the cross sectional area of the shield metal. Combining the above, the scaling of the power loss can be expressed as:

$$P \approx \tfrac{1}{2}(dB/dt)^2 A^2 A_c / \rho L_p \qquad \text{(equation 4)}$$

The resistivity and time-derivative of the magnetic flux are independent of the geometry of the shield, thus the dependence on the geometry of the shield can be summarized as follows:

$$P \propto A^2 A_c / L_p \qquad \text{(equation 5)}$$

Where the shield consists of N metal strips of length 1 and width w, the area would be:

$$A \approx Nlw \qquad \text{(equation 6)}$$

and the perimeter $L_p$ would be:

$$L_p \approx N(2l+w) \approx N2L, \text{ when } w/l \ll 1 \qquad \text{(equation 7)}$$

If the percentage of the metal coverage over the dielectric window is fixed at some fraction α, but the number N and width w of the metal strips is changed, the shield's surface area scales as follows:

$$A = \alpha A_{tot} \approx Nlw \qquad \text{(equation 8)}$$

where $A_{tot}$ is the total area of the dielectric window. Thus, $$Nl \approx \alpha A_{tot}/w \qquad \text{(equation 9)}$$

and, submitting into the expression for $L_p$:

$$L_p \approx 2 \times \alpha A_{tot}/w \qquad \text{(equation 10)}$$

The expressions for A and $L_p$ can then be scaled for the power loss P:

$$P \propto A^2 A_c / L_p \approx \alpha A_{tot} A_c w/2 \propto \alpha w A_c \qquad \text{(equation 11)}$$

For the shield geometry being considered, the cross sectional area of the eddy current path will scale like the cross section of one of the strips. That is:

$$A_c \approx w t_m \qquad \text{(equation 12)}$$

where $t_m$ is the thickness of the shield metal. Substituting this into the scaling equation for the power loss P, the following results:

$$P \propto \alpha w^2 t_m \propto \alpha w^2 \qquad \text{(equation 13)}$$

where the dependence on the thickness of the shield metal has been dropped to focus on primarily on the dependence on the fractional coverage of the dielectric window α and the width w of each metal strip. This shows that for a given fractional coverage of the dielectric window, power losses due to eddy currents in the shield are minimized by using as small a metal strip width as possible, and that the dependence on the width of the metal strips is rather strong.

To the extent that a shield design uses a large fractional coverage of the dielectric window, or uses very wide metal strips—as may be motivated by decreasing the electric field penetration through the shield, as would be the purpose of a Faraday shield—the shield design will suffer increases in parasitic power losses due to eddy currents. However, good electric field attenuation by a Faraday shield can be achieved by using a sufficiently small gap spacing, even with a fractional coverage of α=0.5 (gap spacing=metal finger width). Preferably, the area of the conductors covering the dielectric window is maximized without negatively effecting the inductive coupling of the RF energy into the chamber.

VDE Effective Current Distribution

To determine the impact of the voltage shield electrode on the dome erosion rate, thirteen SiO coupons were placed on the inside of the dome at several locations and the $SiO_2$ etch rates at these locations were measured using a $CF_4$ plasma. The results of these tests are shown in Table 1. The $CF_4$ plasma will etch the $SiO_2$ coupons in the absence of ion bombardment, however, the rate is expected to be higher if capacitive coupling to the coil is present.

For the standard configuration, the baseline $SiO_2$ in the regions of the dome not near the coil was 1065 Å/min and the enhanced etch rate for the region directly beneath the coil was 70% higher. The use of the shield in its grounded configuration reduced the $SiO_2$ etch rate in the region beneath the coil to its baseline value, demonstrating that the ion bombardment was effectively eliminated in this region. However, the grounded configuration also produced a 20% increase in rate above the baseline value in the center region of the dome. With the floating shield, a reduction in oxide etch rate beneath the coil region was also seen, however, the average etch rate for this case was 23% greater than the baseline value, indicating that the level of capacitive coupling was not zero for this case. Additionally, the floating shield configuration gave the best etch rate uniformity across the thirteen coupon locations which were tested, confirming that this configuration produced uniform coupling of the capacitive current across the entire shield region. The tests of the different configurations were repeated using Al,O, coupons placed under the coil and similar trends in the reduction of etch rate were seen for this ceramic material.

TABLE 1

Oxide Etch rate on the underside of the Ceramic dome for various shield configurations

| Coupon Position | Standard Configuration SiO, E/R (Å/min) | V-Electrode Grounded SiO, ER (Å/min) | V-Electrode Floating SiO, ER (Å/min) |
|---|---|---|---|
| Center | 1064 | 1292 | 1369 |
| (5 locations) Coil | 1814 | 1079 | 1255 |
| (4 locations) Bottom | 1066 | 1099 | 1318 |
| (4 locations) average | 1315 | 1157 | 1314 |

There are several problems associated with the use of a grounded electrostatic shield. If the shield is properly designed, it will effectively eliminate the ability to ignite the plasma discharge using only the inductive source since higher voltage (capacitive) breakdown is needed to initiate the discharge. Additionally, the total elimination of capacitive coupling between the plasma and the coil has been found to have a detrimental impact on the plasma stability for certain electronegative gases. This effect has been seen in the increase in the minimum source power needed to sustain plasma for some process gas mixtures. Table 2 below shows power levels required to sustain a plasma for several gases using a grounded shield and a floating shield of the invention.

TABLE 2

| GAS TYPE | VDE FLOATING | VDE GROUNDED |
|---|---|---|
| $N_2$ | 150 WATTS | 150 WATTS |
| $CF_4$ | 150 WATTS | 150 WATTS |
| $CL_2$ | 150 WATTS | 300 WATTS |
| $HB_R$ | 150 WATTS | 600 WATTS |

It is clear from Table 2 that some level of capacitive coupling is desirable for stable operation at relatively lower power levels and that pure inductive coupling is possible only at high power.

Uniformity of Planarization and Recess Etching Processes Using a VDE

The etching rates for grounded and floating VDEs have been compared using polysilicon wafers for wafer planarization processing and for recess processing. These results are summarized in Table 3 below.

TABLE 3

| CONFIG-URATION | PLANARIZATION PROCESS | | RECESS PROCESS | |
|---|---|---|---|---|
| | ETCH RATE (A/MIN) | UNIFORMITY (1 SIGMA) | ETCH RATE (A/MIN) | UNIFORMITY (1 SIGMA) |
| NO SHIELD | 5870 | 2.53 | 533 | 4.6 |
| FLOATING SHIELD | 5964 | 1.93 | 505 | 3.95 |
| NO SHIELD | 6728 | 2.89 | 580 | 4.59 |
| GROUNDED SHIELD | 6792 | 3.38 | 565 | 4.32 |

These results show that the presence of the floating VDE enhances the uniformity of the planarization and recess etching processes. These processes used $SF_6$ processing gas which appears to be relatively unrestrictive to slight changes in ion densities caused by the small amount of capacitive coupling present when using the VDE shield in a floating configuration as compared to the no shield or grounded shield configuration.

The System Control

Figure 7:
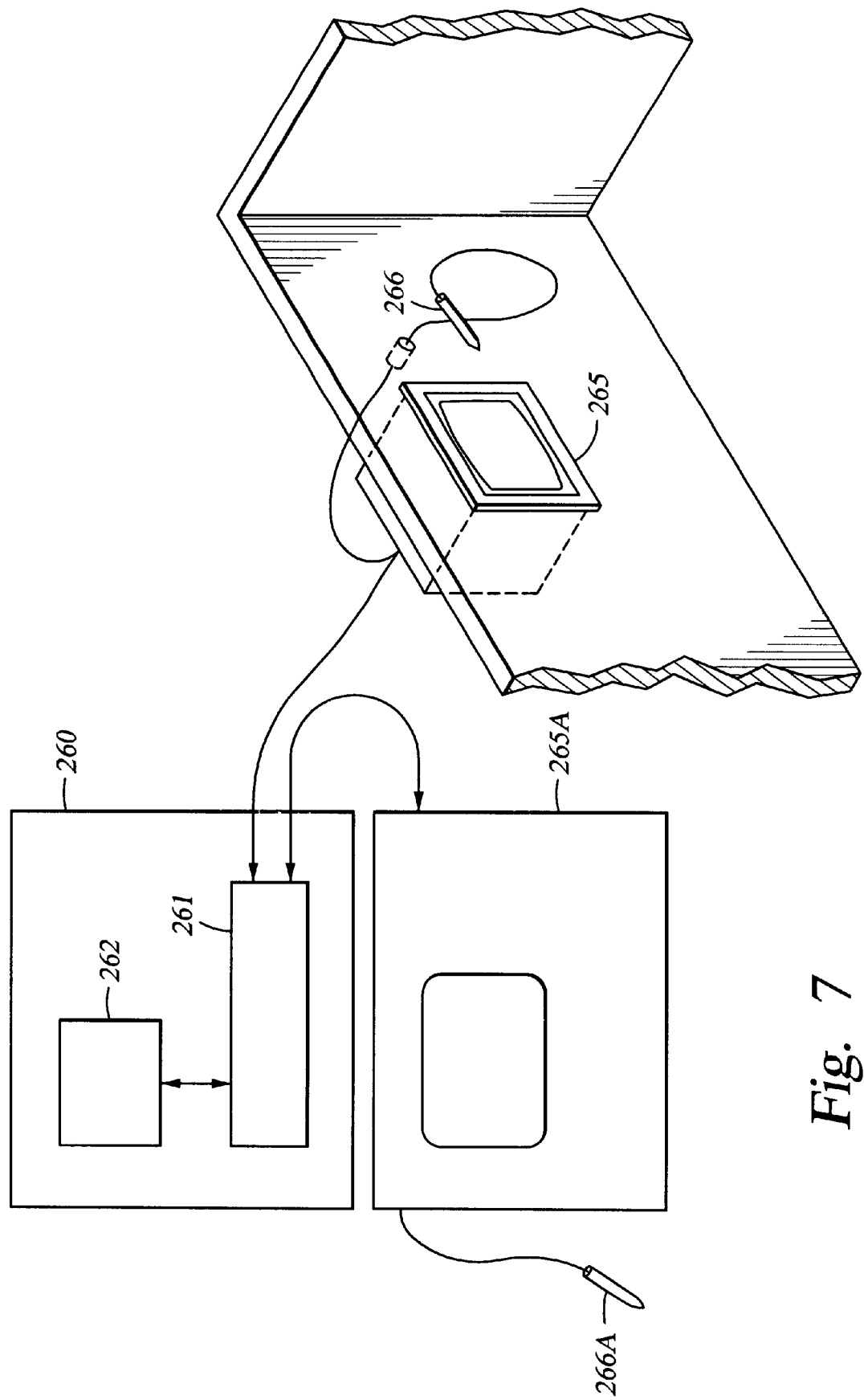
FIG. 7 is a schematic view of a system controller which controls the operation of a system incorporating a VDE of the invention therein.

A system controller 260 shown in FIG. 7 controls the operation of a system incorporating a VDE of the invention. In a preferred embodiment, controller 260 includes a memory 262, such as a hard disk drive, a floppy disk drive (not shown), and a card rack (not shown). The card rack may contain a single-board computer (SBC), analog and digital input/output boards, interface boards, and stepper motor controller boards. The system controller conforms to the Versa Modular European (VME) standard, which defines board, card cage, and connector dimensions and types. The VME standard also defines the bus structure having a 16-bit data bus and 24-bit address bus. System controller 260 operates under the control of a computer program stored on the hard disk drive or other computer programs, such as programs stored on a floppy disk. The computer program dictates, for example, the timing, mixture of gases, RF power levels and other parameters of a particular process. System controller 260 includes a processor 261 coupled to a memory 262. Preferably, memory 262 is a hard disk drive but may also be other kinds of memory, such as ROM, PROM, and others.

The system controller 260 operates under the control of a computer program. The computer program dictates the timing, temperatures, gas flows, RF power levels and other parameters of a particular process. The interface between a user and the system controller is via a CRT monitor 265 and a light pen 266, as depicted in FIG. 7. In a preferred embodiment, two monitors, 265 and 265A, are used, one mounted in the clean room wall for the operators and the other behind the wall for the service technicians. Both monitors simultaneously display the same information, but only one light pen, 266 or 266A, is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, Java or Pascal. Suitable program code is entered into a single file, or multiple files, using a conventional text editor, and stored or embodied in a computer-usable medium, such as a memory system of the computer. If the entered code text is in a hi-h level language the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 8:
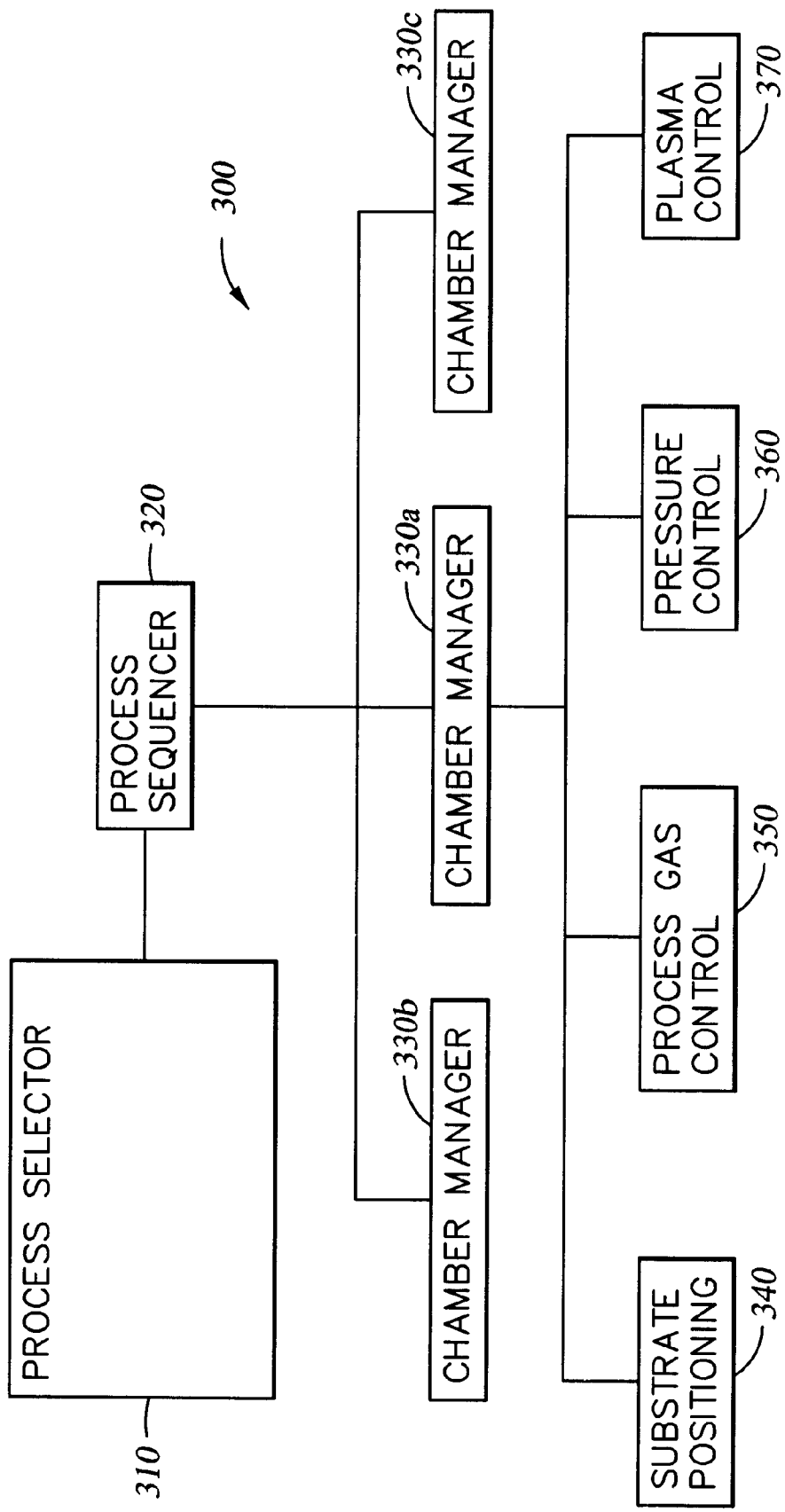
FIG. 8 shows an illustrative block diagram of the hierarchical control structure of computer program

FIG. 8 shows an illustrative block diagram of the hierarchical control structure of computer program 300. A user enters a process set number and process chamber number into a process selector subroutine 310 in response to menus or screens displayed on the CRT monitor by using the light pen interface. Tile process sets are predetermined sets of process parameters necessary to carry out specified processes, and are identified by predefined set numbers. Process selector subroutine 310 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of system controller 260.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber and possibly other chambers (not shown) according to tile process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in a chamber. In operation, chamber manager subroutine 330A selectively schedules or calls the process component subroutines in accordance with the particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

The foregoing descriptions may make other, alternative arrangements apparent to those of skill in the art. The aim of the appended claims is to cover all such changes and modifications that fall within the true spirit and scope of the invention.

What is claimed is:

1. A processing chamber, comprising:
   a) an enclosure having a body and a dielectric window;
   b) a substrate pedestal disposed in the enclosure;
   c) an antenna disposed adjacent the dielectric window; and
   d) an electrode disposed between the dielectric window and the antenna, the electrode comprising a plurality of conductors defining a plurality of gaps therebetween, wherein the conductors are disposed on a dielectric backing member.

2. The chamber of claim 1 wherein the backing member is connected to a support ring and the support ring is disposed adjacent the dielectric window.

3. The chamber of claim 2 wherein the support ring is connected to the chamber and made of a dielectric material.

4. The chamber of claim 3 wherein the conductors are disposed at generally right angles to the direction of current flow in the antenna.

5. The chamber of claim 4 wherein the electrode generally conforms to the shape of the dielectric window.

6. The chamber of claim 3 wherein the conductors have a thickness of between about 1 and 4 one thousandths of an inch.

7. A processing chamber, comprising:
   a) an enclosure having a body and a dielectric window;
   b) a substrate pedestal disposed in the enclosure;

c) an antenna disposed adjacent the dielectric window; and d) an electrode disposed between the dielectric window and the antenna, wherein the electrode comprises a plurality of conductors having a length l and a width w and defines a gap between adjacent conductors having a width w, and wherein the conductors are floating above DC ground potential.

8. A processing chamber, comprising:

a) an enclosure having a body and one of a domed dielectric window and a flat dielectric window;

d) a substrate pedestal disposed in the enclosure;

e) an antenna disposed adjacent the dielectric window; and d) an electrode disposed between the dielectric window and the antenna, wherein the electrode comprises a plurality of conductors having a length l and a width w and defines a gap between adjacent conductors having a width w, and wherein the conductors are floating above DC ground potential.

9. An electrode disposable between an inductive coil and a dielectric window, comprising:

a) a plurality of conductors having a length l and a width w spaced to define a gap between adjacent conductors which is greater than or equal to the width of the conductors, wherein the conductors are disposed on a dielectric backing member.

10. The electrode of claim 9 wherein the conductors are comprised of copper.

11. A method of reducing a current density in an inductively coupled plasma chamber comprising:

a) disposing an electrically floating voltage distribution electrode between an inductive coil and a dielectric window of a chamber, the voltage distribution electrode having a plurality of conductors defining a plurality of gaps, the area of the conductors being substantially equal to the area of the gaps; and b) applying a voltage to the inductive coil.

12. The method of claim 11, wherein the dielectric window is one of a domed dielectric window and a flat dielectric window.

* * * * *

UNITED STATES PATENT AND TRADEMARK OFFICE
CERTIFICATE OF CORRECTION

PATENT NO.    : 6,447,637 B1
DATED         : September 10, 2002
INVENTOR(S)   : Todorov et al.

It is certified that error appears in the above-identified patent and that said Letters Patent is hereby corrected as shown below:

Column 1,
Line 48, replace "it has been some capacitive coupling Measurements" with -- some capacitive coupling measurements --.

Column 4,
Lines 60 and 62, replace "threaded holes" with -- threaded holes 129 --.

Column 7,
Line 10, replace "SiO," with -- $SiO_2$ --.
Line 36, replace "Al,O" with -- $Al_2O_3$ --.
Table 1, replace each occurrence of "SiO," with -- $SiO_2$ --.

Column 8,
Table 2, replace "$CL_2$" with -- $Cl_2$ --.
Table 2, replace "$HB_R$" with -- HBr --.
Table 3, replace each occurrence of "A/MIN" with -- Å/min --.

Signed and Sealed this

Fourth Day of April, 2006

JON W. DUDAS
*Director of the United States Patent and Trademark Office*